(12) United States Patent
Zhang

(10) Patent No.: US 10,848,102 B2
(45) Date of Patent: Nov. 24, 2020

(54) CRYSTAL OSCILLATOR

(71) Applicant: SHENZHEN GOODIX TECHNOLOGY CO., LTD., Shenzhen (CN)

(72) Inventor: Mengwen Zhang, Shenzhen (CN)

(73) Assignee: SHENZHEN GOODIX TECHNOLOGY CO., LTD., Shenzhen (CN)

( * ) Notice: Subject to any disclaimer, the term of this patent is extended or adjusted under 35 U.S.C. 154(b) by 0 days.

(21) Appl. No.: 16/423,069

(22) Filed: May 27, 2019

(65) Prior Publication Data
US 2019/0288644 A1 Sep. 19, 2019

Related U.S. Application Data

(63) Continuation of application No. PCT/CN2018/078507, filed on Mar. 9, 2018.

(51) Int. Cl.
H03B 5/32 (2006.01)
H03B 5/36 (2006.01)
H03B 5/04 (2006.01)
H03B 5/06 (2006.01)
H03B 5/12 (2006.01)
H03B 5/24 (2006.01)
H03K 3/02 (2006.01)

(52) U.S. Cl.
CPC ............. H03B 5/364 (2013.01); H03B 5/04 (2013.01); H03B 5/06 (2013.01); H03B 5/1228 (2013.01); H03B 5/24 (2013.01); H03B 5/366 (2013.01); H03K 3/02 (2013.01)

(58) Field of Classification Search
CPC . H03B 5/364; H03B 5/04; H03B 5/06; H03B 5/1228; H03B 5/24; H03B 5/366; H03K 3/02
USPC ....... 331/116 R, 116 FE, 154, 158, 185, 186
See application file for complete search history.

(56) References Cited

U.S. PATENT DOCUMENTS

2005/0174183 A1* 8/2005 Tachibana ............. H03B 5/364
                                                       331/158
2006/0119447 A1   6/2006 Hagino
2008/0042764 A1   2/2008 Hagino
2011/0298556 A1  12/2011 Lin et al.
2013/0257550 A1  10/2013 Ishikawa et al.
(Continued)

FOREIGN PATENT DOCUMENTS

CN    101686037 A    3/2010
CN    103368501 A   10/2013
CN    106026922 A   10/2016

Primary Examiner — Richard Tan

(57) ABSTRACT

Provided is a crystal oscillator, including: a crystal; an oscillating circuit including a first oscillating transistor and a second oscillating transistor, where the first oscillating transistor and the second oscillating transistor are configured to provide transconductance for starting oscillation and maintaining oscillation of the crystal; a first driving circuit configured to generate a stable reference current; and a second driving circuit, configured to supply an operating voltage to the oscillating circuit and make an operating current of the first oscillating transistor and the second oscillating transistor be a stable current according to the reference current, where the operating voltage is used to control the first oscillating transistor and the second oscillating transistor to operate in a sub-threshold region.

13 Claims, 4 Drawing Sheets

(56) References Cited

U.S. PATENT DOCUMENTS

| | | |
|---|---|---|
| 2016/0099682 A1 | 4/2016 | Liu et al. |
| 2016/0285465 A1 | 9/2016 | Abe et al. |
| 2017/0077931 A1 | 3/2017 | Viegas |
| 2017/0201258 A1 | 7/2017 | Viegas |

* cited by examiner

CRYSTAL OSCILLATOR

CROSS REFERENCE TO RELATED APPLICATIONS

The present application is a continuation of international application No. PCT/CN2018/078507, filed on Mar. 9, 2018, which is hereby incorporated by reference in its entirety.

TECHNICAL FIELD

Embodiments of the present disclosure relate to the field of circuits, and in particular, to a crystal oscillator.

BACKGROUND

A Pierce oscillator (or referred to as a Pierce crystal oscillator) is a crystal oscillator with an inverter structure, and two metallic oxide semiconductor field effect transistors (MOSFET) in the Pierce oscillator contribute transconductance, which is beneficial for reducing power consumption required to maintain oscillation. However, the Pierce oscillator has some defects: bias currents of two MOS transistors are affected by gate-source voltages $V_{GS}$S of the MOS transistors and a sum of the gate-source voltages of the two MOS transistors is equal to a power supply voltage $V_{DD}$, therefore, if $V_{DD}$ is large, $V_{GS}$S of the MOS transistors are necessarily large, which may lead to a serious high-order effect, and the problem is that although power consumption of the MOS transistors is large, the MOS transistors in fact do not provide sufficient transconductance, which is not beneficial for fast starting oscillation of the crystal.

SUMMARY

An embodiment of the present disclosure provides a crystal oscillator, which could provide large transconductance for fast starting oscillation of a crystal with low power consumption.

In a first aspect, provided is a crystal oscillator including: a crystal; an oscillating circuit including a first oscillating transistor and a second oscillating transistor, where the first oscillating transistor and the second oscillating transistor are configured to provide transconductance for starting oscillation and maintaining oscillation of the crystal; a first driving circuit configured to generate a stable reference current; and a second driving circuit, configured to supply an operating voltage to the oscillating circuit and make an operating current of the first oscillating transistor and the second oscillating transistor be a stable current according to the reference current, where the operating voltage is used to control the first oscillating transistor and the second oscillating transistor to operate in a sub-threshold region.

Therefore, a crystal oscillator of an embodiment of the present disclosure may supply an oscillating circuit with a stable operating voltage and a stable operating current, so that power consumption of the crystal oscillator is controllable, and the operating voltage enables transistors to operate in a sub-threshold region, such that under a same current condition, a transistor can provide larger transconductance, which is beneficial for fast starting oscillation of the crystal oscillator, and reducing the power consumption of the crystal oscillator.

With reference to the first aspect, in some implementation manners of the first aspect, where the second driving circuit includes a negative feedback loop configured to receive the reference current generated by the first driving circuit and generate the operating voltage according to the reference current.

With reference to the first aspect, in some implementation manners of the first aspect, the negative feedback loop includes a first current control transistor and a second current control transistor, and the first current control transistor and the second current control transistor are configured to control the operating current of the first oscillating transistor and the second oscillating transistor to be the stable current.

With reference to the first aspect, in some implementation manners of the first aspect, connection structures of the first current control transistor and the second current control transistor is the same as connection structures of the first oscillating transistor and the second oscillating transistor, and a ratio of sizes of the first oscillating transistor and the first current control transistor is equal to a ratio of sizes of the second oscillating transistor and the second current control transistor.

With reference to the first aspect, in some implementation manners of the first aspect, the negative feedback loop further includes a third current control transistor, an amplifier and a first voltage control transistor, where the third current control transistor is configured to control the operating current of the first oscillating transistor and the second oscillating transistor, and the amplifier outputs the operating voltage to the oscillating circuit through the first voltage control transistor;

a drain of the third current control transistor is connected to the first driving circuit and is configured to receive the reference current output by the first driving circuit, a gate of the first current control transistor is connected to a drain of the first current control transistor, a gate of the second current control transistor is connected to a drain of the second current control transistor, and a gate of the third current control transistor is connected to the drain of the third current control transistor; and the drain of the third current control transistor is further connected to a first input end of the amplifier, a second input end of the amplifier is connected to the drain of the first current control transistor and the drain of the second current control transistor, an output end of the amplifier is connected to a gate of the first voltage control transistor, a source of the first current control transistor is connected to a drain of the first voltage control transistor, and the drain of the first voltage control transistor is configured to output the operating voltage.

With reference to the first aspect, in some implementation manners of the first aspect, the negative feedback loop further includes a fourth current control transistor and a second voltage control transistor, where the fourth current control transistor is configured to control the operating current of the first oscillating transistor and the second oscillating transistor, the second voltage control transistor is configured to output the operating voltage to the oscillating circuit, and a drain of the fourth current control transistor is connected to the first driving circuit and is configured to receive the reference current output by the first driving circuit;

the drain of the fourth current control transistor is further connected to a gate of the second voltage control transistor, a gate of the fourth current control transistor is connected to a gate of the first current control transistor and a gate of the second current control transistor, the gate of the first current control transistor is connected to a drain of the first current control transistor, and the gate of the second current control transistor is connected to a drain of the second current control transistor; and a source of the first current control transistor is connected to a source of the second voltage control transistor, and the source of the second voltage control transistor is configured to output the operating voltage.

With reference to the first aspect, in some implementation manners of the first aspect, a first capacitor is further connected between a source of the first current control transistor and the ground, and the first capacitor is configured to perform phase compensation on the operating voltage.

Optionally, the first capacitor may be configured to perform phase compensation on the operating voltage and may also be configured to reduce a ripple of the operating voltage. In addition, the first capacitor is also configured to isolate a power supply of the first driving circuit and the operating voltage, which further improves a power supply rejection ratio PSRR, so that an influence of power supply noise, interference, and the like on the crystal oscillator could be reduced.

With reference to the first aspect, in some implementation manners of the first aspect, a ratio of sizes of the first oscillating transistor and the first current control transistor is N:M, a ratio of sizes of the second oscillating transistor, the second current control transistor and the third current control transistor is N:M:L, and the operating current of the first oscillating transistor and the second oscillating transistor is $I_{ref}$N/L, where $I_{ref}$ is the reference current.

With reference to the first aspect, in some implementation manners of the first aspect, the first driving circuit is further configured to control an amplitude of an oscillating signal input to the crystal.

Since a source of the first oscillating transistor is configured to receive an operating voltage, a variation of the operating voltage will eventually be converted into spurs or phase noise on an oscillating signal output by the crystal. In addition, if the operating voltage makes the crystal oscillator enter a voltage limiting region, the spurs or phase noise problem will be further deteriorated, however, employing the first driving circuit of an embodiment of the present disclosure can make the crystal oscillator operate at a proper amplitude, thereby avoiding a phase noise problem caused by the amplitude of the crystal oscillator entering the voltage limiting region and improving phase noise performance of the crystal oscillator.

With reference to the first aspect, in some implementation manners of the first aspect, the first driving circuit includes a first bias transistor, a second bias transistor, a third bias transistor, a fourth bias transistor, a fifth bias transistor, a sixth bias transistor, and a second capacitor;

where a drain of the first bias transistor is connected to a drain of the third bias transistor, the drain of the first bias transistor is connected to a gate of the first bias transistor, a drain of the second bias transistor is connected to a drain of the fourth bias transistor, the gate of the first bias transistor is connected to a gate of the second bias transistor, and a gate of the third bias transistor is connected to the drain of the fourth bias transistor; a drain of the fifth bias transistor is connected to the drain of the fourth bias transistor, a source of the fifth bias transistor is connected to the gate of the fourth bias transistor, the gate of the fourth bias transistor is further connected to one end of the second capacitor, and the other end of the second capacitor is configured to input the oscillating signal; and a gate of the sixth bias transistor is connected to the gate of the second bias transistor, a source of the sixth bias transistor, a source of the first bias transistor and a source of the second bias transistor are connected, and a drain of the sixth bias transistor is configured to output the reference current.

With reference to the first aspect, in some implementation manners of the first aspect, when an AC signal in the oscillating signal increases, a drain voltage of the fourth bias transistor decreases, drain currents of the first bias transistor, the second bias transistor, and the third bias transistor decrease, the reference current output by the first driving circuit decreases, the operating current of the first oscillating transistor and the second oscillating transistor decreases, the transconductance of the first oscillating transistor and the second oscillating transistor decreases, and an amplitude of the oscillating signal decreases.

With reference to the first aspect, in some implementation manners of the first aspect, in a case of an AC signal, the operating voltage is equivalent to a ground voltage, and the first oscillating transistor and the second oscillating transistor provide the transconductance for starting oscillation and maintaining oscillation of the crystal.

With reference to the first aspect, in some implementation manners of the first aspect, in the sub-threshold region, the transconductance of the first oscillating transistor and the second oscillating transistor is proportional to the operating current of the first oscillating transistor and the second oscillating transistor.

With reference to the first aspect, in some implementation manners of the first aspect, a gate of the first oscillating transistor is connected to a gate of the second oscillating transistor, a drain of the first oscillating transistor is connected to a drain of the second oscillating transistor, and a source of the first oscillating transistor is configured to receive the operating voltage.

DESCRIPTION OF EMBODIMENTS

Embodiments of the present disclosure will be described hereinafter in conjunction with the drawings in the embodiments of the present disclosure.

Figure 1:
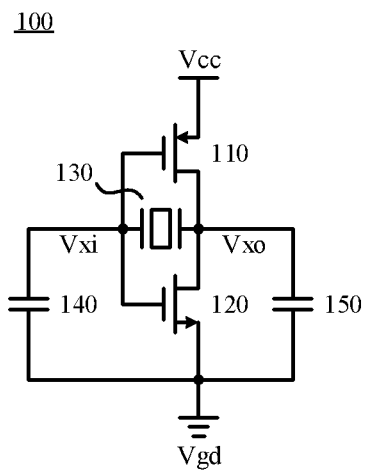
FIG. 1 is a schematic structural diagram of a typical crystal oscillator.

FIG. 1 is a schematic diagram of a typical structure of a crystal oscillator. As shown in FIG. 1, a crystal oscillator 100 includes a transistor 110, a transistor 120, a crystal 130, a capacitor 140, and a capacitor 150.

A gate of the transistor 110 is connected to a gate of the transistor 120, and a drain of the transistor 110 is connected to a drain of the transistor 120, that is, the transistor 110 and the transistor 120 are a connection structure of an inverter, and the transistor 110 and the transistor 120 are configured to provide transconductance for starting oscillation and maintaining oscillation of the crystal 130.

However, the oscillator shown in FIG. 1 has the following problems: drain currents (or bias currents) of the transistor 110 and the transistor 120 are determined by gate-source voltages $V_{GS}$S of the transistors, while a sum of the $V_{GS}$ of the transistor 110 and the $V_{GS}$ of the transistor 120 is equal to a power supply voltage $V_{cc}$. Since $V_{cc}$ is affected by process, voltage, temperature, power consumption of the transistors is uncontrollable due to an influence of PVT. Moreover, when $V_{cc}$ is large, $V_{GS}$S of the transistors are necessarily large, thus, under some process conditions it may cause a serious high-order effect of the transistors, for example, an vertical electric field causes mobility to drop, and the problem is that although power consumption of the transistors is large, the transistors in fact do not provide sufficient transconductance, which is not beneficial for fast starting oscillation of the crystal.

In view of this, an embodiment of the present disclosure provides an oscillating circuit, which can provide large transconductance for starting oscillation and maintaining oscillation of an oscillator with low power consumption.

Figure 2:
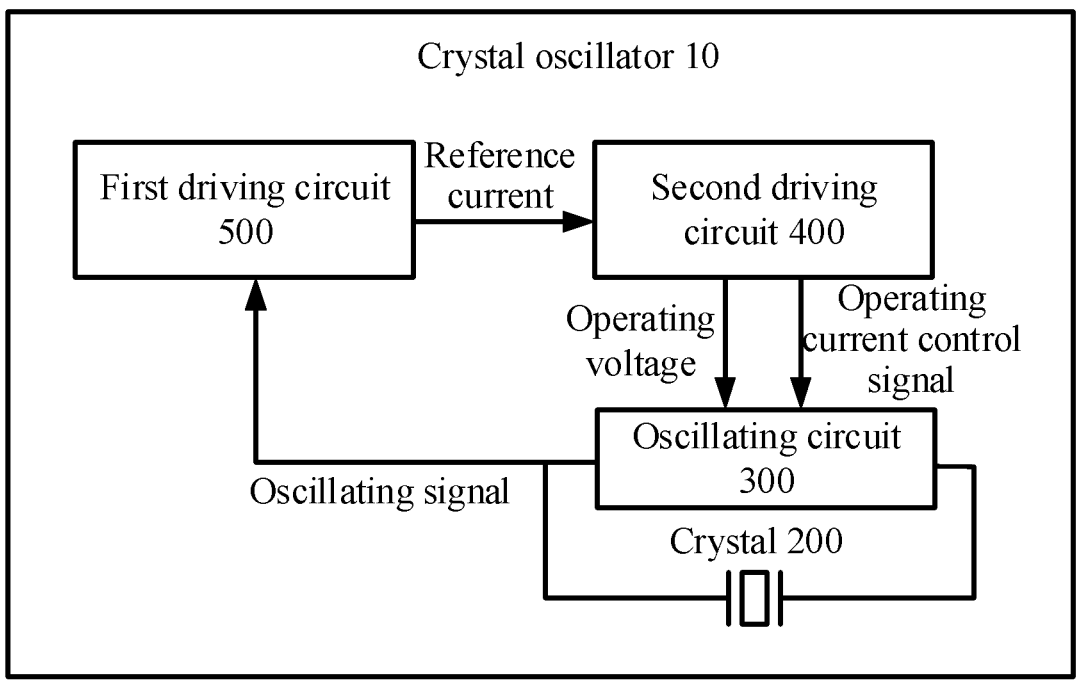
FIG. 2 is a schematic structural diagram of a crystal oscillator according to an embodiment of the present disclosure.

FIG. 2 is a schematic structural diagram of a crystal oscillator according to an embodiment of the present disclosure. As shown in FIG. 2, a crystal oscillator 10 includes a crystal 200, an oscillating circuit 300, a first driving circuit 500 and a second driving circuit 400, where:

the oscillating circuit 300 includes a first oscillating transistor and a second oscillating transistor, and the first oscillating transistor and the second oscillating transistor are configured to provide transconductance for starting oscillation and maintaining oscillation of the crystal 200;

the first driving circuit 500 is configured to generate a stable reference current, and output the reference current to the second driving circuit; and the second driving circuit 400 is configured to supply an operating voltage to the oscillating circuit and make an operating current of the first oscillating transistor and the second oscillating transistor be a stable current according to the reference current, where the operating voltage is used to control the first oscillating transistor and the second oscillating transistor to operate in a sub-threshold region.

Optionally, in the embodiment of the present disclosure, the oscillating circuit may be an oscillating circuit that adopts an inverter structure, for example, a Pierce crystal oscillating circuit, and therefore, the first oscillating transistor and the second oscillating transistor in the oscillating circuit can both provide transconductance for oscillation of the crystal, which is benefit for rapidly starting oscillation of the crystal.

In the embodiment of the present disclosure, the second driving circuit is configured to receive the reference current output by the first driving circuit, supply an operating voltage to the oscillating circuit, and make the first oscillating transistor and the second oscillating transistor operate at a stable current. For example, the second driving circuit may control, according to an operating current control signal, the operating current of the first oscillating transistor and the second oscillating transistor in the oscillating circuit to be the stable current, where the operating voltage is a stable voltage that does not vary with PVT. Therefore, power consumption of the crystal oscillator of the embodiment of the present disclosure is controllable with respect to an existing crystal oscillator.

Optionally, the operating current control signal may be an operating current of the second driving circuit, for example, the operation current of the second driving circuit is mirrored to the oscillating circuit through circuit structures of the second driving circuit and the oscillating circuit, and if the operation current of the second driving circuit is a stable current, the current mirrored to the oscillating circuit is also a stable current.

In addition, the operating voltage generated by the second driving circuit can enable the first oscillating transistor and the second oscillating transistor to operate in a sub-threshold region. Since transconductance of the MOS transistor is proportional to a drain current of the MOS transistor in the sub-threshold region and conversion efficiency of current transconductance in the sub-threshold region is high, it means that a current required for same transconductance is smaller, which is beneficial for reducing the power consumption of the crystal oscillator. Moreover, two oscillating transistors in the oscillating circuit of the embodiment of the present disclosure both provide transconductance, and therefore, the crystal oscillator of the embodiment of the present disclosure can provide larger transconductance under a same current condition, which is beneficial for fast starting oscillation and maintaining oscillation of the crystal oscillator.

It should be understood that the reference current generated by the first driving circuit is a stable current, and the stable current referred to herein does not mean that the reference current must be a constant current, but only indicates that the reference current does not vary with PVT.

It should also be understood that the operating voltage output by the second driving circuit is a stable voltage, and the stable voltage referred to herein does not mean that the operating voltage must be a constant voltage, but only indicates that the operating voltage does not vary with PVT, or that the operating voltage varies with PVT but the second driving circuit may adjust the outputted operating voltage to cancel the influence brought by a variation of PVT.

In the embodiment of the present disclosure, the first driving circuit may be configured to generate a stable reference current, for example, the first driving circuit may be implemented by adopting a typical circuit structure of a bias circuit, or may be implemented by adopting other equivalent circuits, which is not limited to the embodiment of the present disclosure. Further, the first driving circuit may also be configured to control an amplitude of an oscillating signal input to the crystal, which will be described in detail in the following embodiments.

Therefore, a crystal oscillator of an embodiment of the present disclosure may supply an oscillating circuit with a stable operating voltage and a stable operating current, so that power consumption of the crystal oscillator is controllable, and the operating voltage can make the transistor operate in a sub-threshold region, such that under a same current condition, the transistor can provide larger transconductance, which is beneficial for fast starting oscillation of the crystal oscillator, and reducing the power consumption of the crystal oscillator.

In the prior art, as shown in FIG. 1, since one end of the transistor 110 is controlled by an input voltage $V_{CC}$, a variation of $V_{CC}$ may be converted into spurs or phase noise on the outputted oscillating signal $V_{x0}$, which eventually leads to an oscillation amplitude of the outputted oscillating signal $V_{xo}$ uncontrollable, and if the input voltage $V_{CC}$ makes the oscillator enter a voltage limiting region, the problem of spurs and phase noise may become more serious.

Optionally, in the embodiment of the present disclosure, the oscillating signal output by the oscillating circuit 300 may be input to the first driving circuit 500, and the first driving circuit 500 may also control the amplitude of the oscillating signal, which can prevent the oscillating circuit from entering the voltage limiting region, and thus phase noise performance of the oscillating circuit could be improved.

Hereinafter, implementation manners of a crystal oscillator according to an embodiment of the present disclosure will be described in detail with reference to specific examples in FIGS. 3 to 8.

It should be understood that examples shown in FIGS. 3 to 8 are intended to help those skilled in the art better understand embodiments of the present disclosure, rather than for limiting the scope of the embodiments of the present disclosure. It will be obvious for those skilled in the art to make various equivalent modifications or variations according to FIGS. 3 to 8 as illustrated, which also fall within the scope of the embodiments of the present disclosure.

Figure 3:
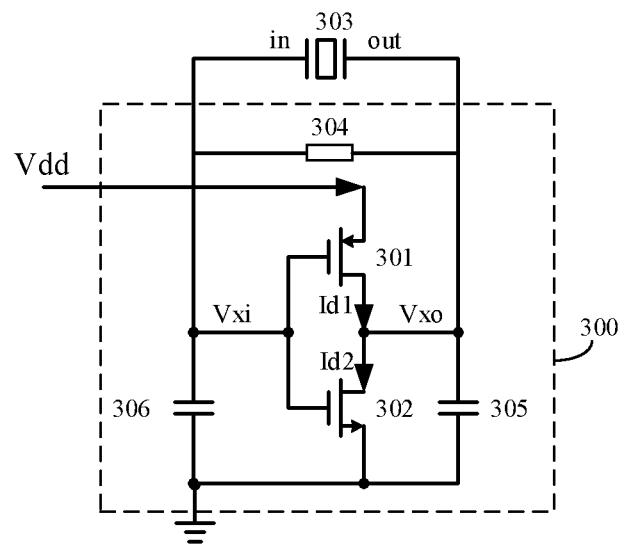
FIG. 3 is an exemplary schematic structural diagram of an oscillating circuit in the crystal oscillator shown in FIG. 2.

FIG. 3 is a schematic structural diagram of an oscillating circuit according to an embodiment of the present disclosure. As shown in FIG. 3, an oscillating circuit 300 includes a first oscillating transistor 301, a second oscillating transistor 302, a resistor 304, a capacitor 305, and a capacitor 306.

Specifically, a drain of the first oscillating transistor 301 is connected to a drain of the second oscillating transistor 302, a gate of the first oscillating transistor 301 is connected to a gate of the second oscillating transistor 302, a source of the first oscillating transistor 301 is configured to receive an operating voltage $V_{dd}$, an operating current of the drain of the first oscillating transistor 301 is Id1, an operating current of the drain of the second oscillating transistor is Id2, the Id1 and the Id2 are a stable current and do not vary with PVT.

The gate of the first oscillating transistor 301 and the gate of the second oscillating transistor 302 are also connected to one end of the resistor 304, and the drain of the first oscillating transistor 301 and the drain of the second oscillating transistor 302 are also connected to the other end of the resistor 304.

In this embodiment, the resistor 304 is also connected in parallel with a crystal 303, and the crystal 303 may correspond to the crystal 200 in FIG. 2 that may include an input (in) end and an output (out) end. One end of the capacitor 306 is connected to an input end of the crystal 303, the other end of the capacitor 306 is grounded, one end of the capacitor 305 is connected to an output end of the crystal 303, and the other end of the capacitor 305 is grounded.

The resistor 304 is configured to supply DC bias voltages to the first oscillating transistor 301 and the second oscillating transistor 302, and the capacitor 305, the capacitor 306 and the crystal 303 are configured to determine an oscillating frequency of the crystal, $V_{xi}$ is an oscillating signal input to the crystal, and $V_{xo}$ is an oscillating signal output from the crystal.

Optionally, in the embodiment of the present disclosure, in a case of a small AC signal, the operating voltage $V_{dd}$ is equivalent to a ground voltage, and thus the first oscillating transistor 301 and the second oscillating transistor 302 may both provide transconductance for starting oscillation of the crystal 303, thereby enabling the crystal 303 to start oscillation rapidly.

Optionally, in the embodiment of the present disclosure, the first oscillating transistor 301 may be a PMOS transistor or other equivalent devices, and the second oscillating transistor 302 may be an NMOS transistor or other equivalent devices, which is not limited in the embodiment of the present disclosure.

It should be understood that in the embodiment of the present disclosure, the crystal may also be referred to as a crystal plate, and the crystal 303 may be a quartz crystal or a crystal of other materials, which is not limited by the embodiment of the present disclosure.

Figure 4:
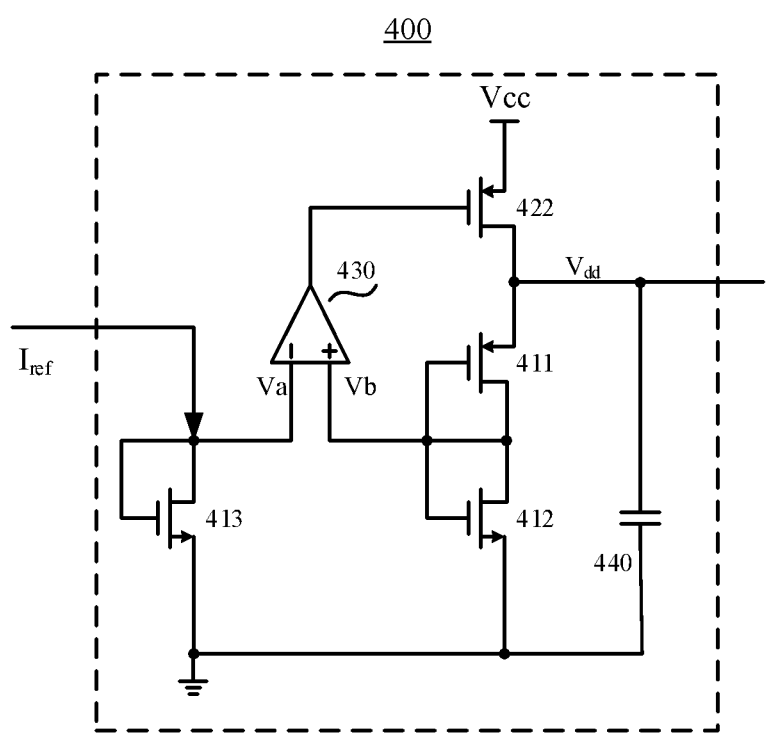
FIG. 4 is an exemplary schematic structural diagram of a second driving circuit in the crystal oscillator shown in FIG. 2.

FIG. 4 is a schematic structural diagram of a second driving circuit according to an embodiment of the present disclosure. As shown in FIG. 4, a second driving circuit 400 includes a negative feedback loop, where the negative feedback loop may include a first current control transistor 411, a second current control transistor 412, a third current control transistor 413, an amplifier 430, and a first voltage control transistor 422, where the first current control transistor 411, the second current control transistor 412, and the third current control transistor 413 are configured to determine an operating current of a first oscillating transistor and a second oscillating transistor.

A specific connection relationship is as follows: a drain of the third current control transistor 413 is configured to receive a reference current (corresponding to $I_{ref}$ in FIG. 4) output by a first driving circuit, a gate of the first current control transistor 411 is connected to a drain of the first current control transistor 411, a gate of the second current control transistor 412 is connected to a drain of the second current control transistor 412, and a gate of the third current control transistor 413 is connected to the drain of the third current control transistor 413; and the drain of the third current control transistor 413 is connected to a first input end (such as an inverting input end) of the amplifier 430, a second input end of the amplifier 430 is connected to the drain of the first current control transistor 411 and the drain of the second current control transistor 412, an output end of the amplifier 430 is connected to a gate of the first voltage control transistor 422, and a source of the first current control transistor 411 is connected to a drain of the first voltage control transistor 422.

The first voltage control transistor 422 is an executive element of the amplifier 430, that is, the amplifier 430 may implement control of the operating voltage $V_{dd}$ output to the oscillating circuit through the first voltage control transistor 422, and the drain of the first voltage control transistor 422 is configured to output the operating voltage $V_{dd}$ to the oscillating circuit.

In this embodiment, connection structures of the first current control transistor 411 and the second current control transistor 412 are the same as those of the first oscillating transistor and the second oscillating transistor, that is, both are a connection structure of an inverter. Furthermore, a ratio of sizes of the first current control transistor 411 and the first oscillating transistor 301 is equal to a ratio (or a ratio of width to length, that is, a ratio of a gate width to a gate length) of sizes of the second current control transistor 412 and the second oscillating transistor 302. In this way, when the $V_{GS}$S of the transistors are equal, the operating current of the first oscillating transistor and the second oscillating transistor is proportional to the reference current, that is, the operating current is a stable current.

According to a virtual short principle of the input end of the amplifier, a voltage of the first input end of the amplifier is equal to a voltage of the second input end of the amplifier, that is, $V_a=V_b$, that is, the first current control transistor 411, the second current control transistor 412 and the third current control transistor 413 have equal gate voltages that are equal to $V_a$ or $V_b$, and the sources of the first current control transistor 411, the second current control transistor 412 and the third current control transistor 413 are all grounded, and therefore, $V_{GS}S$ of the first current control transistor 411, the second current control transistor 412 and the third current control transistor 413 are equal, so that it can be concluded that the drain current of the first current control transistor 411, the drain current of the second current control transistor 412 and the drain current of the third current control transistor 413 are respectively proportional to a size of the first current control transistor 411, a size of the second current control transistor 412 and a size of the third current control transistor 413. In other words, it is assumed that the sizes of the drain currents of the first current control transistor 411, the second current control transistor 412 and the third current control transistor 413 are denoted as S1, S2, and S3, respectively, and the drain currents of the first current control transistor 411, the second current control transistor 412, and the third current control transistor 413 are denoted as I1, I2, and I3, respectively, then I1/S1=I2/S2=I3/S3.

It can be seen in combination with FIGS. 3 and 4 that, when $V_{xi}$ is a DC voltage, a connection structure of the second oscillating transistor 302 is the same as that of the third current control transistor 413, that is, the $V_{GS}S$ of those two are equal. Accordingly, the drain current of the second oscillating transistor 302 and the drain current of the drain current of the third current control transistor 413 are respectively proportional to the size of the second oscillating transistor 302 and the size of the third current control transistor 413.

In summary, if a ratio of sizes of the first oscillating transistor and the first current control transistor is N:M, a ratio of sizes of the second oscillating transistor, the second current control transistor and the third current control transistor is N:M:L, and the drain current of the third current control transistor is the reference current, denoted as $I_{ref}$, then the drain current of the first current control transistor 411 is $I_{ref}$·M/L, and the drain current (that is, the operating current) of the first oscillating transistor 301 and the second oscillating transistor 302 is $I_{ref}$·N/L. Since the reference current is a stable current that does not vary with PVT, the operating current of the first oscillating transistor and the second oscillating transistor is also a stable current that does not vary with PVT.

Optionally, in this embodiment, the second driving circuit 400 may further include a first capacitor 440, which is connected between the output end of the operating voltage and the ground and is configured to perform phase compensation on the operating voltage to make the operating voltage more stable.

Optionally, in this embodiment, the first current control transistor 411 and the first voltage control transistor 422 may be PMOS transistors, and the second current control transistor 412 and the third current control transistor 413 may be NMOS transistors or other equivalent devices, which is not limited in this embodiment of the present disclosure.

Figure 5:
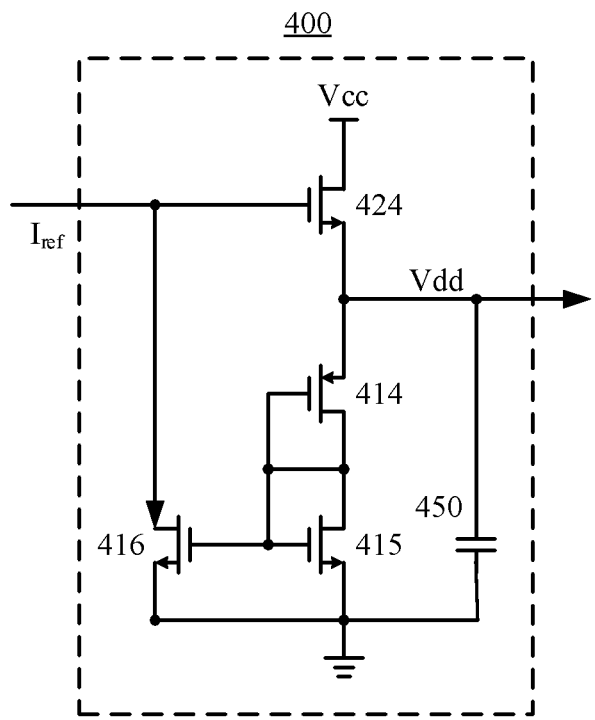
FIG. 5 is another exemplary schematic structural diagram of a second driving circuit in the crystal oscillator shown in FIG. 2.

FIG. 5 is a schematic structural diagram of a second driving circuit according to another embodiment of the present disclosure. As shown in FIG. 5, a second driving circuit 400 may include a negative feedback loop.

In this embodiment, the negative feedback loop may include a first current control transistor 414, a second current control transistor 415, a fourth current control transistor 416, and a second voltage control transistor 424. Connection structures of the first current control transistor 414 and the second current control transistor 415 are the same as those of the first oscillating transistor and the second oscillating transistor, that is, both are a connection structure of an inverter, and a ratio of sizes of the first current control transistor 414 and the first oscillating transistor is equal to a ratio of sizes of the second current control transistor 415 and the second oscillating transistor, so that the operating current of the first oscillating transistor and the second oscillating transistor is proportional to the reference current, that is, the operating current is a stable current.

Specifically, a gate of the fourth current control transistor 416 is connected to a gate of the first current control transistor 414 and a gate of the second current control transistor 415, a drain of the fourth current control transistor 416 is configured to receive a reference current (corresponding to $I_{ref}$ in FIG. 5) output by the first driving circuit, the drain of the fourth current control transistor 416 is connected to a gate of the second voltage control transistor 424, and a source of the second voltage control transistor 424 is configured to output the operating voltage.

It should be understood that in this embodiment, the first current control transistor 414, the second current control transistor 415, the fourth current control transistor 416 and the second voltage control transistor 424 are respectively similar to the first current control transistor 411, the second current control transistor 412, the third current control transistor 413 and the first voltage control transistor 422 in the embodiment shown in FIG. 4, and functions of each of the transistors will not be repeatedly described here.

It should also be understood that although an amplifier is not included in this embodiment, actually, in this embodiment, the fourth current control transistor 416 functions as an amplifier, and the second voltage control transistor 424 is equivalent to an executive element of the amplifier and is configured to control the operating voltage $V_{dd}$ output by the second driving circuit 400.

Comparing circuit structures shown in FIG. 4 and FIG. 5, it can be seen that the second driving circuit shown in FIG. 4 is a second-order circuit, therefore, it is required that the first capacitor 440 performs phase compensation on the outputted operating voltage $V_{dd}$ to improve stability of the outputted operating voltage $V_{dd}$; and the second driving circuit shown in FIG. 5 is a first-order circuit, it is not necessary to perform phase compensation on $V_{dd}$, but if the first capacitor 450 is provided in the second driving circuit shown in FIG. 5, a ripple of the operating voltage $V_{dd}$ can be further reduced. In addition, the first capacitor 450 may also configured to isolate the power supply $V_{cc}$ of the first driving circuit and the operating voltage $V_{dd}$, which further improves a power supply rejection ratio (PSRR), so that an influence of power supply noise, interference, and the like on the crystal oscillator could be reduced, thereby further improving the phase noise performance of the crystal oscillator.

Optionally, in this embodiment, the first current control transistor 414 may be a PMOS transistor or other equivalent devices, and the second voltage control transistor 424, the second current control transistor 415, and the fourth current control transistor 416 may be NMOS transistors or other equivalent devices, which is not limited in this embodiment of the present disclosure.

Figure 6:
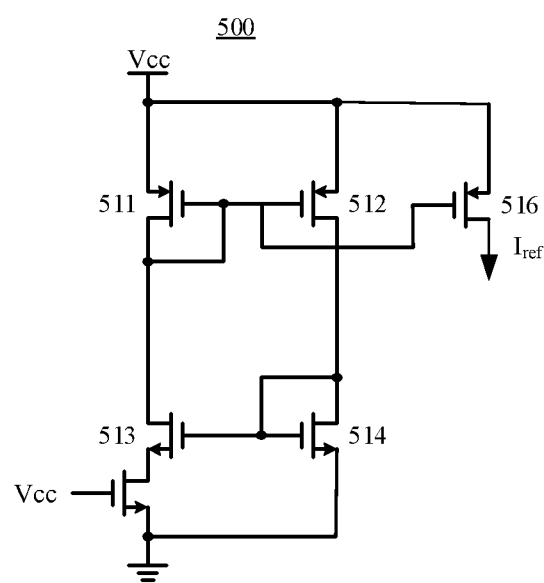
FIG. 6 is an exemplary schematic structural diagram of the first driving circuit in the crystal oscillator shown in FIG. 2.

FIG. 6 is a schematic structural diagram of a first driving circuit according to an embodiment of the present disclosure. As shown in FIG. 6, a first driving circuit 500 may include a first bias transistor 511, a second bias transistor 512, a third bias transistor 513, a fourth bias transistor 514, and a sixth bias transistor 516.

A drain of the first bias transistor 511 is connected to a drain of the third bias transistor 513, and a drain of the second bias transistor 512 is connected to a drain of the fourth bias transistor 514;

a gate of the first bias transistor 511 is connected to a gate of the second bias transistor 512, and a gate of the third bias transistor 513 is connected to a gate of the fourth bias transistor 514; and the drain of the first bias transistor 511 is connected to the gate of the first bias transistor 511, the drain of the fourth bias transistor 514 is connected to the gate of the fourth bias transistor 514, a gate of the sixth bias transistor 516 is connected to the gate of the second bias transistor, a source of the sixth bias transistor 516, a source of the first bias transistor 511 and a source of the second bias transistor 512 are connected, and a drain of the sixth bias transistor 516 is configured to output a reference current. For example, the drain of the sixth bias transistor 516 is connected to the drain of the third current control transistor 413 shown in FIG. 4 or to the drain of the fourth current control transistor 416 shown in FIG. 5, so that the reference current may be output to the drain of the third current control transistor 413 or the drain of the fourth current control transistor 416.

It can be seen from FIG. 6 that, the first driving circuit is a typical bias circuit independent of a power supply voltage, therefore, the first driving circuit may output a stable reference current to the second driving circuit, and further, the second driving circuit may control an operating current of the oscillating circuit to be a stable current according to the stable reference current, and working principles thereof will not be repeatedly described here.

Figure 7:
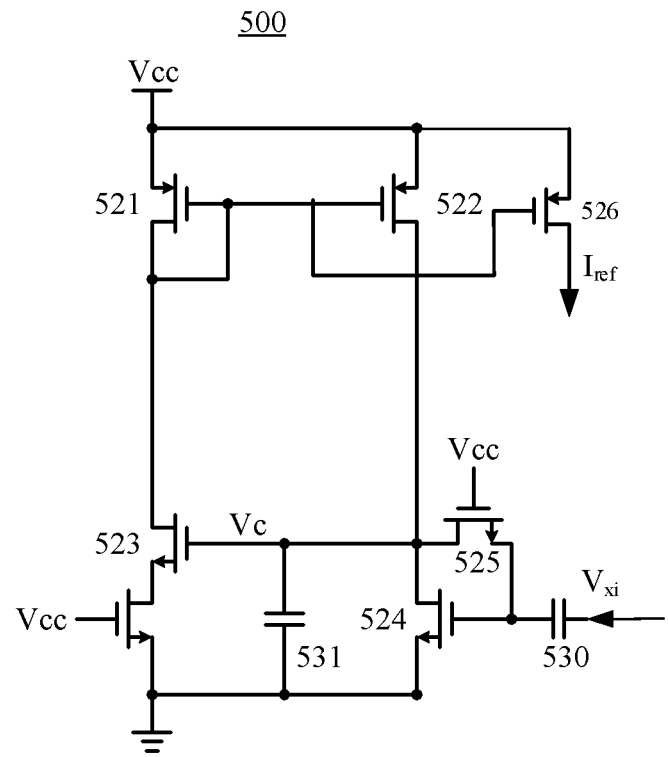
FIG. 7 is another exemplary schematic structural diagram of the first driving circuit in the crystal oscillator shown in FIG. 2.

FIG. 7 is a schematic structural diagram of a first driving circuit according to another embodiment of the present disclosure. The first driving circuit in this embodiment may be configured not only to generate a reference current (corresponding to $I_{ref}$ in FIG. 7), but also to control an oscillation amplitude of a crystal oscillator.

As shown in FIG. 7, the first driving circuit may include a first bias transistor 521, a second bias transistor 522, a third bias transistor 523, a fourth bias transistor 524, and a sixth bias transistor 526, which are respectively similar to the first bias transistor 511, the second bias transistor 512, the third bias transistor 513, the fourth bias transistor 514, and the sixth bias transistor 516 in the embodiment shown in FIG. 6, and working principles thereof will not be repeatedly described here.

This embodiment differs from the embodiment shown in FIG. 6 in that: in this embodiment, a fifth bias transistor 525 is connected in parallel between a gate of the fourth bias transistor 524 and a drain of the fourth bias transistor 524, and an oscillating signal $V_{xi}$ that is an oscillating signal input to an input end of the crystal is input to the gate of the fourth bias transistor 524 through a second capacitor 530.

Thus, if $V_{xi}$ is a DC signal, the gate of the fourth bias transistor 524 and the drain of the fourth bias transistor 524 are shorted, and a working manner of the fourth bias transistor 524 is the same as that of the fourth bias transistor 514 in the embodiment shown in FIG. 6.

If $V_{xi}$ is an AC signal, the gate of the fourth bias transistor 524 and the drain of the fourth bias transistor 524 are separated, and AC coupling is performed on $V_{xi}$ by the second capacitor 530, the AC signal in $V_{xi}$ may be extracted, that is, the AC signal in $V_{xi}$ is applied to the gate of the fourth bias transistor 524, while a DC bias voltage generated by the fifth bias transistor 525 is also applied to the gate of the fourth bias transistor 524.

Then, when the AC signal in the oscillating signal $V_{xi}$ increases, a drain voltage (that is, $V_c$ in FIG. 7) of the fourth bias transistor 524 decreases, and drain currents of the first bias transistor 521, the second bias transistor 522, and the third bias transistor 523 decrease, so that the reference current output by the first driving circuit 500 also decreases accordingly, meanwhile, the operating current of the first oscillating transistor and the second oscillating transistor decreases. Since the operating current of the first oscillating transistor and the second oscillating transistor is proportional to transconductance of the first oscillating transistor and the second oscillating transistor, the transconductance of the first oscillating transistor and the second oscillating transistor decreases accordingly, and eventually an amplitude of the oscillating signal is decreased, thereby implementing control of an oscillation amplitude of the crystal oscillator.

Since a source of the first oscillating transistor is configured to receive the operating voltage $V_{dd}$, a variation of the operating voltage $V_{dd}$ will eventually be converted into spurs or phase noise on the oscillating signal output by the crystal. In addition, if $V_{dd}$ makes the crystal oscillator enter a voltage limiting region, the spurs or phase noise problem will be further deteriorated, however, employing the first driving circuit of an embodiment of the present disclosure can make the crystal oscillator operate at a proper amplitude, thereby avoiding a phase noise problem caused by the amplitude of the crystal oscillator entering the voltage limiting region and improving phase noise performance of the crystal oscillator.

Optionally, in this embodiment, the first bias transistor 521, the second bias transistor 522, and the sixth bias transistor 526 may be PMOS transistors, or other equivalent devices, and the third bias transistor 523, the fourth bias transistor 524, and the fifth bias transistor 525 may be NMOS transistors, or other equivalent devices, which is not limited in this embodiment of the present disclosure.

Figure 8:
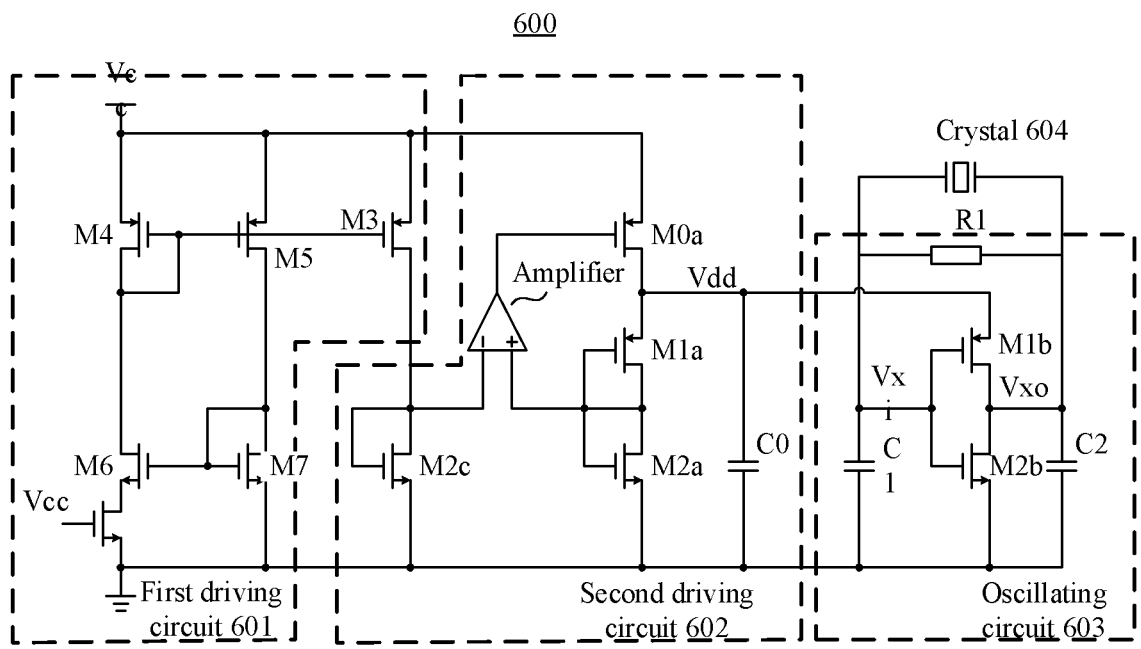
FIG. 8 is an exemplary schematic structural diagram of a crystal oscillator according to an embodiment of the present disclosure.

FIG. 8 is an exemplary structural diagram of a crystal oscillator according to an embodiment of the present disclosure. As shown in FIG. 8, a crystal oscillator 600 includes a first driving circuit 601, a second driving circuit 602, an oscillating circuit 603, and a crystal 604, where the crystal 604 corresponds to the crystal 200 in FIG. 2 and the crystal 303 in FIG. 3.

The oscillating circuit 603 includes a transistor M1b, a transistor M2b, a capacitor C1, a capacitor C2 and a resistor R1, where the transistor M1b, the transistor M2b, the capacitor C1, the capacitor C2 and the resistor R1 respectively correspond to the first oscillating transistor 301, the second oscillating transistor 302, the capacitor 306, the capacitor 305 and the resistor 304 in the embodiment shown in FIG. 3, and functions thereof are the same as functions of the corresponding devices, and detailed operating processes will not be repeatedly described here.

The second driving circuit 602 includes a transistor M0a, a transistor M1a, a transistor M2a, a transistor M2c and an amplifier, which respectively correspond to the first voltage control transistor 422, the first current control transistor 411, the second current control transistor 412, the third current control transistor 413 and the amplifier 430 in the embodiment shown in FIG. 4, and functions thereof are the same as functions of the corresponding devices, and detailed operating processes will not be repeatedly described here.

The first driving circuit 601 includes a transistor M3, a transistor M4, a transistor M5, a transistor M6 and a transistor M7, which respectively correspond to the sixth bias transistor 516, the first bias transistor 511, the second bias transistor 512, the third bias transistor 513 and the fourth bias transistor 514 in the embodiment shown in FIG. 6, and functions thereof are the same as functions of the corresponding devices, and detailed operating processes will not be repeatedly described here.

It should be understood that the circuit structure shown in FIG. 8 is only an example, and the first driving circuit 601 may also be implemented by using the circuit structure shown in FIG. 7, or using a similar equivalent circuit; alternatively, the second driving circuit 602 may be implemented by using the circuit structure shown in FIG. 5 or a similar equivalent circuit, which is not specifically limited in this embodiment of the present disclosure.

The foregoing descriptions are merely specific embodiments of the present disclosure, but the protection scope of the present disclosure is not limited thereto, persons skilled in the art who are familiar with the art could readily think of variations or substitutions within the technical scope disclosed by the present disclosure, and these variations or substitutions shall fall within the protection scope of the present disclosure. Therefore, the protection scope of the present disclosure shall be subject to the protection scope of the claims.

What is claimed is:

1. A crystal oscillator, comprising:
   a crystal;
   an oscillating circuit comprising a first oscillating transistor and a second oscillating transistor, wherein the first oscillating transistor and the second oscillating transistor are configured to provide transconductance for starting oscillation and maintaining oscillation of the crystal;
   a first driving circuit configured to generate a stable reference current; and
   a second driving circuit, configured to supply an operating voltage to the oscillating circuit and make an operating current of the first oscillating transistor and the second oscillating transistor be a stable current according to the reference current, wherein the operating voltage is configured to control the first oscillating transistor and the second oscillating transistor to operate in a sub-threshold region;
   wherein the second driving circuit comprises a negative feedback loop configured to receive the reference current generated by the first driving circuit and generate the operating voltage according to the reference current;
   wherein the negative feedback loop comprises a first current control transistor and a second current control transistor, and the first current control transistor and the second current control transistor are configured to control the operating current of the first oscillating transistor and the second oscillating transistor to be the stable current;
   wherein connection structures of the first current control transistor and the second current control transistor is the same as connection structures of the first oscillating transistor and the second oscillating transistor.

2. The crystal oscillator according to claim 1, wherein a ratio of sizes of the first oscillating transistor and the first current control transistor is equal to a ratio of sizes of the second oscillating transistor and the second current control transistor.

3. The crystal oscillator according to claim 1, wherein the negative feedback loop further comprises a third current control transistor, an amplifier and a first voltage control transistor, wherein the third current control transistor is configured to control the operating current of the first oscillating transistor and the second oscillating transistor, and the amplifier outputs the operating voltage to the oscillating circuit through the first voltage control transistor;
   a drain of the third current control transistor is connected to the first driving circuit and is configured to receive the reference current output by the first driving circuit, a gate of the first current control transistor is connected to a drain of the first current control transistor, a gate of the second current control transistor is connected to a drain of the second current control transistor, and a gate of the third current control transistor is connected to the drain of the third current control transistor; and
   the drain of the third current control transistor is further connected to a first input end of the amplifier, a second input end of the amplifier is connected to the drain of the first current control transistor and the drain of the second current control transistor, an output end of the amplifier is connected to a gate of the first voltage control transistor, a source of the first current control transistor is connected to a drain of the first voltage control transistor, and the drain of the first voltage control transistor is configured to output the operating voltage.

4. The crystal oscillator according to claim 3, wherein a ratio of sizes of the first oscillating transistor and the first current control transistor is N:M, a ratio of sizes of the second oscillating transistor, the second current control transistor and the third current control transistor is N:M:L, and the operating current of the first oscillating transistor and the second oscillating transistor is $I_{ref}$N/L, wherein $I_{ref}$ is the reference current.

5. The crystal oscillator according to claim 1, wherein the negative feedback loop further comprises a fourth current control transistor and a second voltage control transistor, wherein the fourth current control transistor is configured to control the operating current of the first oscillating transistor and the second oscillating transistor, the second voltage control transistor is configured to output the operating voltage to the oscillating circuit, and a drain of the fourth current control transistor is connected to the first driving circuit and is configured to receive the reference current output by the first driving circuit;
   the drain of the fourth current control transistor is further connected to a gate of the second voltage control transistor, a gate of the fourth current control transistor is connected to a gate of the first current control transistor and a gate of the second current control transistor, the gate of the first current control transistor is connected to a drain of the first current control transistor, and the gate of the second current control transistor is connected to a drain of the second current control transistor; and
   a source of the first current control transistor is connected to a source of the second voltage control transistor, and the source of the second voltage control transistor is configured to output the operating voltage.

6. The crystal oscillator according to claim 1, wherein a first capacitor is further connected between a source of the first current control transistor and the ground, and the first capacitor is configured to perform phase compensation on the operating voltage.

7. The crystal oscillator according to claim 1, wherein the first driving circuit is further configured to control an amplitude of an oscillating signal input to the crystal.

8. The crystal oscillator according to claim 7, wherein the first driving circuit comprises a first bias transistor, a second bias transistor, a third bias transistor, a fourth bias transistor, a fifth bias transistor, a sixth bias transistor, and a second capacitor;
wherein a drain of the first bias transistor is connected to a drain of the third bias transistor, the drain of the first bias transistor is connected to a gate of the first bias transistor, a drain of the second bias transistor is connected to a drain of the fourth bias transistor, the gate of the first bias transistor is connected to a gate of the second bias transistor, and a gate of the third bias transistor is connected to the drain of the fourth bias transistor; a drain of the fifth bias transistor is connected to the drain of the fourth bias transistor, a source of the fifth bias transistor is connected to the gate of the fourth bias transistor, the gate of the fourth bias transistor is further connected to one end of the second capacitor, and the other end of the second capacitor is configured to input the oscillating signal; and
a gate of the sixth bias transistor is connected to the gate of the second bias transistor, a source of the sixth bias transistor, a source of the first bias transistor and a source of the second bias transistor are connected to a power supply voltage, and a drain of the sixth bias transistor is configured to output the reference current.

9. The crystal oscillator of claim 8, wherein when an AC signal in the oscillating signal increases, a drain voltage of the fourth bias transistor decreases, drain currents of the first bias transistor, the second bias transistor, and the third bias transistor decrease, the reference current output by the first driving circuit decreases, the operating current of the first oscillating transistor and the second oscillating transistor decreases, the transconductance of the first oscillating transistor and the second oscillating transistor decreases, and an amplitude of the oscillating signal decreases.

10. The crystal oscillator according to claim 7, wherein the first driving circuit comprises a first bias transistor, a second bias transistor, a third bias transistor, a fourth bias transistor, and a sixth bias transistor;
wherein a drain of the first bias transistor is connected to a drain of the third bias transistor, and a drain of the second bias transistor is connected to a drain of the fourth bias transistor;
a gate of the first bias transistor is connected to a gate of the second bias transistor, and a gate of the third bias transistor is connected to a gate of the fourth bias transistor;
the drain of the first bias transistor is connected to the gate of the first bias transistor, the drain of the fourth bias transistor is connected to the gate of the fourth bias transistor, a gate of the sixth bias transistor is connected to the gate of the second bias transistor; and
a source of the sixth bias transistor, a source of the first bias transistor and a source of the second bias transistor are connected to a power supply voltage, and a drain of the sixth bias transistor is configured to output the reference current.

11. The crystal oscillator according to claim 1, wherein in a case of an AC signal, the operating voltage is equivalent to a ground voltage, and the first oscillating transistor and the second oscillating transistor provide the transconductance for oscillation and maintaining oscillation of the crystal.

12. The crystal oscillator according to claim 1, wherein in the sub-threshold region, the transconductance of the first oscillating transistor and the second oscillating transistor is proportional to the operating current of the first oscillating transistor and the second oscillating transistor.

13. The crystal oscillator according to claim 1, wherein a gate of the first oscillating transistor is connected to a gate of the second oscillating transistor, a drain of the first oscillating transistor is connected to a drain of the second oscillating transistor, and a source of the first oscillating transistor is configured to receive the operating voltage.

* * * * *